United States Patent [19]

Hillenius et al.

[11] Patent Number: 5,063,422
[45] Date of Patent: Nov. 5, 1991

[54] DEVICES HAVING SHALLOW JUNCTIONS

[75] Inventors: Steven J. Hillenius, Summit; Joseph Lebowitz, Watchung; Ruichen Liu, Warren; William T. Lynch, Summit, all of N.J.

[73] Assignee: AT&T Bell Laboratories, Murray Hill, N.J.

[21] Appl. No.: 515,550

[22] Filed: Apr. 26, 1990

Related U.S. Application Data

[63] Continuation of Ser. No. 209,149, Jun. 20, 1988, abandoned.

[51] Int. Cl.$^5$ .................... H01L 29/10; H01L 27/02; H01L 23/48
[52] U.S. Cl. ................... 357/23.3; 357/23.12; 357/41; 357/42; 357/67
[58] Field of Search ............. 357/67, 23.3, 67 S, 357/23.12, 42, 41; 437/40, 41, 45, 200, 57

[56] References Cited

U.S. PATENT DOCUMENTS

| | | | |
|---|---|---|---|
| 4,502,209 | 3/1985 | Eizenberg | 357/67 |
| 4,765,845 | 8/1988 | Takada | 357/71 |
| 4,769,686 | 9/1988 | Horiuchi et al. | 357/675 |
| 4,791,074 | 12/1988 | Tsunashima | 437/160 |
| 4,901,134 | 2/1990 | Misawa et al. | 357/715 |

FOREIGN PATENT DOCUMENTS 59-35465 2/1984 Japan.
62-54470 3/1987 Japan.

OTHER PUBLICATIONS

S. M. Sze "Physics of Semiconductor Devices Second Edition" pp. 12-16, 1981.
R. Muller & T. Kamins, "Device Electronics for Integrated Circuits" John Wiley & Sons, 1986, pp. 462-465.
Horiuchi, M. et al., "Solid-II: High-Voltage High--Gain kilo-Ångstrom-Channel-Length CMOSFET's Using Silicide with Self-Aligned Ultrashallow (3S) Junction," *IEEE Transactions Elect. Dev.*, ED-33, No. 2, 2/86.
Shichijo, H. et al., "Characterization of N-Channel and P-Channel LPCVD Polysilicon MOSFETS", *IEDM'83*, pp. 202-205.
Vaidya, S. et al. "NMOS Ring Oscillators with Cobalt-Silicided P-diffused Shallow Junctions Formed During the 'Poly-Plug' Contact Doping Cycle," *IEEE Trans. Elect. Dev.*, vol. ED-33, No. 9, 9/86, pp. 1321.
Lai et al., *IEEE Transactions on Electronic Devices*, ED-33 (9), 1308 (1986).
Kobayashi et al., "Comparison of TiSi$_2$ and WSi$_2$ Silicide Shallow Junctions for Sub-micron CMOSs," *Abstracts of papers*, 1986 Symposium on VLSI Technology, San Diego, CA.
C. Barrett et al., *The Principles of Engineering Materials*, Prentice-Hall, Englewood Cliffs, N.J.; 1973, pp. 148 and 149.

*Primary Examiner*—Jerome Jackson, Jr.
*Assistant Examiner*—Ngan Van Ngo
*Attorney, Agent, or Firm*—David I. Caplan

[57] ABSTRACT

In CMOS based integrated circuits, stricter design rules require source and drain junctions shallower than 2500 Å. By using a specific device configuration, a shallow junction is obtainable while resistance to latch-up is improved and other electrical properties, e.g., low leakage current, are maintained. To achieve this result the p-channel device should have an activation energy of the junction reverse leakage current region less than 1.12 eV, with a junction dopant region shallower than 1200 Å and a monotonically decreasing junction dopant profile.

10 Claims, 4 Drawing Sheets

BF$_2$ DOSE INTO SILICIDE (X10$^{15}$cm$^{-2}$)

DEPTH ($\mu$m)

DEVICES HAVING SHALLOW JUNCTIONS

This application is a continuation of application Ser. No. 209,149, filed on June 20, 1988, now abandoned.

BACKGROUND OF THE INVENTION

1. Field of the Invention

This invention relates to the fabrication of integrated circuits (ICs) and in particular to the fabrication of ICs relying on complementary metal oxide on silicon (CMOS) configurations.

2. Art Background

A widely employed IC configuration involves CMOS technology. In this configuration an N- and P-tub are formed as shown at 18 and 19 of FIG. 1. (The N and P tubs have respective electrons and holes as the majority carrier). The gate semiconductor material 20 and 21 is generally n type. The device channel regions 40 and 42 are generally the same carrier types as their respective tubs (although not necessarily), but when inverted during operation conduct through a majority carrier opposite to that of the associated tub. Material having the opposite majority carrier from their underlying tubs are used as source and drain regions 30 and 31. The depth 50 in FIG. 1, of the source and drain junctions are strongly influenced by the device design rule, i.e., the size of the smallest feature critical to the device operation such as the width 60 of the gate in FIG. 1. (The junction depth is defined as the average depth measured in a direction normal to the plane of the silicon substrate (immediately before the first step in source and drain formation) and from this plane to a point where the material changes from n to p type.) As design rules become stricter, e.g., gates become narrower, the depth of the junctions must be correspondingly shallower to maintain acceptable device performance. For example, the junction depth should be no greater than about 0.25 $\mu m$ for a design rule of 0.75 $\mu m$ or smaller.

Additionally, for stricter design the decrease in device dimensions produces a strong tendency for the two parasitic bipolar transistors shown in FIG. 2 to produce a catastrophic current flow (denominated latch-up) in response to a transient excursion in operating voltage. Thus, the regions forming these parasitic transistors should be advantageously tailored to lessen this tendency without unacceptably degrading other electrical properties such as leakage current. However, suggested approaches for reducing latch-up tendencies generally add processing complexities (e.g., insulating regions for isolation), unacceptably increase leakage current or increase spacing between devices. Additionally, solely addressing latch-up properties is not enough. To achieve relatively low junction resistance while employing a relatively shallow source and drain, a metal silicide, 64, e.g., tungsten silicide or titanium silicide, overlying junction dopant regions, 62 and 63, is desirable. This region serves as a low resistance current shunt between the shallow junction dopant region and its respective electrical contact.

A variety of attempts have been made to produce relatively shallow source and drain silicided junctions while obtaining a degree of latch-up immunity and maintaining an acceptable leakage current, e.g., a current less than $10^{-12}$ amps/$\mu m^2$ for typical CMOS applications. In one method described by Lau et al. (*IEEE Transactions on Electronic Devices*, ED-33 (9), 1308 (1986)), a precursor to the metal silicide is formed in the junction region. For example, when titanium silicide is desired, titanium is deposited onto the silicon substrate in the junction region. The precursor region is implanted with a suitable dopant; arsenic and/or phosphorus for the n-channel devices in the P-tub and boron entities for p-channel devices in the N-tub. The wafer is then heated to form the metal silicide and to drive a portion of the dopant from the silicide into the underlying region to form the junction dopant regions 62 and 63. Although reportedly this junction has relatively good latch-up immunity, the depth of the resulting junction is significantly greater than desirable for strict design rules.

Another suggested approach for shallow junction fabrication is described by Kobayashi et al. in a paper entitled "Comparison of $TiSi_2$ and $WSi_2$ Silicide Shallow Junctions for Sub-micron CMOSs," *Abstract of papers*, 1986 Symposium on VLSI technology, San Diego, CA. In this method, the precursor region is produced and heated to form the silicide. This silicide is then implanted and heated to induce partial diffusion of the implanted dopant from the silicide region into the underlying silicon to form the junction dopant region. Junction depths of 0.28 and 0.23 $\mu m$ were obtained for tungsten and titanium silicide, respectively.

The tungsten silicide junction obtained by Kobayashi is, thus, too deep for strict design rules. The titanium silicide region is relatively shallow. However, the dopant profile in the junction (as shown in FIG. 1 of the Kobayashi abstract) increases for at least 700 Å from the silicide/silicon interface into the underlying silicon. If all the implanted dopant had been confined initially in the silicide region, the dopant concentration would monotonically decrease into the silicon from the silicide/silicon interface. Therefore, the profile actually obtained indicates that a significant level of dopant had been implanted below the silicide. Indeed, Kobayashi discusses the desirability of implanting additional arsenic into the underlying silicon to increase dopant concentration, and presumably, to lower the junction resistance. This implantation procedure, however, is undesirable because the resulting implant damage must be removed by high temperature annealing to ensure acceptable leakage currents. As a consequence of the annealing, the junctions are significantly deepened beyond the region desirable for 0.75 $\mu m$ or smaller design rules.

SUMMARY OF THE INVENTION

Shallow junctions are obtainable while relative latch-up immunity, and acceptable leakage current are maintained through the use of a specific device configuration. This configuration depends on p-channel source and/or drain junction dopant region(s) in the N-tub 1) that are shallower than 1200 Å, 2) that have a dopant concentration that yields a reverse leakage current with an activation energy lower than the bandgap energy of silicon and 3) that have a dopant concentration profile that is highest at the silicide interface.

In one embodiment to produce this configuration 1) the silicide precursor region is converted to the silicide before implantation, 2) the silicide and not the underlying silicon is implanted with a dose of p-type dopant such as boron dopant, e.g., B or $BF_2$, typically in the range $1 \times 10^{15}$ to $1 \times 10^{16}$ $cm^{-2}$ and 3) the implanted region is heated to a temperature in the range 700° C. to 925° C. for a time period typically in the range 30 to 180 minutes for conventional furnace heating or temperatures in the range 800° C. to 1000° C. for the shorter periods required by rapid thermal annealing. By controlling p-channel source and/or drain junction dopant, the inventive device has improved latch-up holding voltage, e.g., 4 volts, a leakage current as low as $10^{-15}$ amps/$\mu$m$^2$, and an $R_c$ that is a small percentage of the device channel resistance. A relatively small junction contribution to the device resistance occurs because the dopant concentration of only the p-channel device is constrained to obtain the desired latch-up and leakage current characteristic. Since the p-channel device, as compared to the n-channel device, has a relatively high resistance, the larger p-channel junction resistance remains negligible.

BRIEF DESCRIPTION OF THE DRAWING

FIGS. 3 through 6A and 6B, 7A and 7B are illustrative of attainable properties.

DETAILED DESCRIPTION

Figure 1:
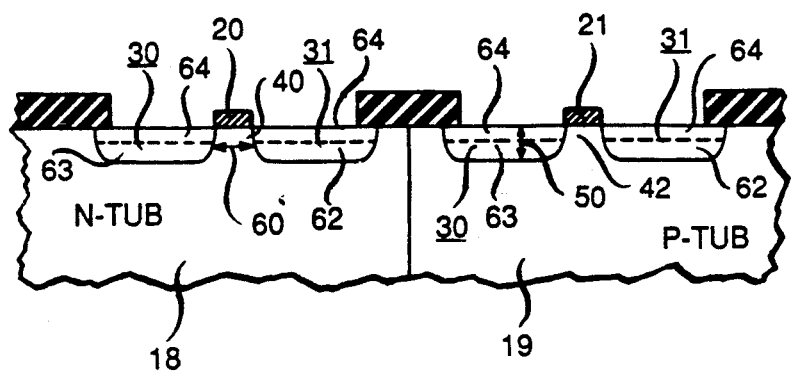
FIGS. 1 and 2 are illustrative of configuration involved in the inventive devices.
Figure 2:
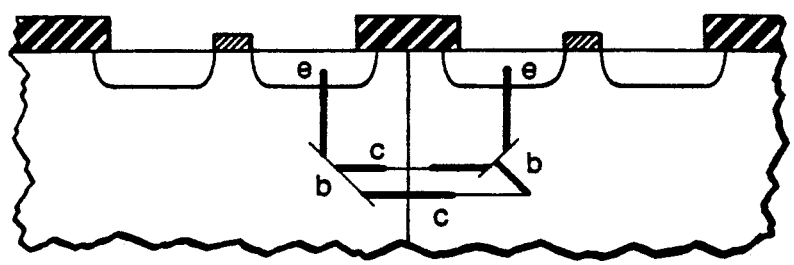

As discussed, the invention involves a device having a shallow junction, a junction shallower than 2500 Å, that is relatively latch-up immune, that has an acceptable leakage current, and that has a relatively low contribution to device resistance from the junction region. (In the context of this invention improved immunity to latch-up is a 10 percent increase in holding voltage relative to a device where dopant is implanted into a non-silicide region, e.g., silicon or a silicide precursor. However, it is even more desirable to have improvements of 50 percent or greater). The desired electrical properties are obtained by adjusting the depth and dopant concentration of the junction dopant region. This concentration should be sufficiently small so that the activation energy of reverse leakage current across the junction is less than the band gap energy of silicon, i.e., 1.12 electron volts. (Recombination-generation centers formed by defects or by dopants, such as gold, lower activation energy but substantially increase leakage current. Although their presence is not precluded, it is not desirable because of the effect on leakage current. The activation energy of reverse current across the junction is determined by measuring reverse bias junction leakage current vs. temperature as described by C. Barrett et al., *The Principles of Engineering Materials*, Prentice-Hall, Englewood Cliffs, N.J., 1973, pp. 148 and 149).

Most significantly the adjustment of dopant concentration and depth to yield an activation energy less than 1.12 electron volts is required only for the p-channel devices. In these devices, the channel resistance is generally two to four times greater than that of the n-channel devices. As a result, the contribution to device resistance from the lower dopant concentration is not particularly significant relative to the higher channel resistance of the p-channel devices. In this manner the operating characteristics of the device are not unacceptably altered while relative latch-up immunity and acceptable leakage current are obtained.

A suitable expedient for obtaining the inventive devices involves the formation of a silicide junction region followed by implantation of dopant into this region and diffusion of a portion of this dopant into the underlying silicon to form the junction dopant region. (A process involving silicide formation followed by implantation and diffusion is described in mutually assigned U.S. application Ser. No. 128,742 dated Dec. 4, 1987, now U.S. Pat. No. 4,914,500, issued on Apr. 3, 1990, to R. Liu, W. T. Lynch and D. S. Williams, which is hereby incorporated by reference.)

Basically this procedure, in one embodiment, involves depositing a metal onto a silicon substrate in the source and drain junction regions. Typically, to maintain junctions shallower than 0.25 $\mu$m the deposited material should have a thickness generally in the range 0.01 to 0.05 $\mu$m. Thicknesses less than 0.01 $\mu$m yield inadequate silicide formation while thicknesses greater than 0.05 $\mu$m lead to excessive junction depth.

Formation of the silicide is accomplished by heating the substrate to a temperature generally in the range 400° C. to 900° C. The precise temperature employed depends on the particular material used. For example, a suitable temperature protocol for cobalt is generally a first treatment in the range 400° C. to 500° C. to convert the precursor to the monosilicide followed by a treatment in the range 700° C. to 800° C. to convert to the disilicide, while temperatures in the range 600° C. to 900° C. are typically employed for titanium. The duration of the heating should be sufficiently short so that the established dopant profiles throughout the device are not substantially altered due to diffusion. Typical times in the range 15 minutes to 2 hours for conventional heating and 1 second to 2 hours for rapid thermal anneals are employed. A control sample is easily employed to determine a desirable temperature and treatment time for a desired device configuration and silicide composition.

The silicide is then implanted with a dopant entity suitable for forming the dopant junction region. Typically for an n-type junction region an arsenic and/or phosphorus implantation is used while for a p-type junction region a boron entity, e.g., B or BF$_2$ implantation is employed. The acceleration voltage of the implantation apparatus should be controlled so that the peak concentration of the implanted ions lies within the silicide, and preferably lies a distance from the silicide/silicon interface into the silicide of at least 0.10, most preferably $\frac{1}{3}$, of the average silicide thickness. (The silicide thickness at any point is measured in a direction normal to the substrate surface).

The implanted dopant concentration limits the level of dopant that is introduced after diffusion into the dopant junction region. Typically, implanted doses in the range $1 \times 10^{15}$ to $1 \times 10^{16}$ cm$^{-2}$ are employed. The diffusion temperature and treatment time is controlled to induce a dopant concentration in the junction dopant region that yields an activation energy of the reverse leakage current of less than 1.12 electron volts. The precise combination of time and temperature to yield this result varies with the material silicide, the thickness of the silicide, the implanted dopant, and the concentration of the dopant. Generally, diffusion temperatures in the range 750° to 925° C. are employed in conjunction with diffusion times in the range 15 to 180 minutes. A control sample is easily employed to determine the precise conditions required for a given combination of device parameters. For example, the Table indicates the leakage current, holding voltage and activation energy for a variety of diffusion times and temperatures.

The diffusion time and temperature should also be controlled so that the average depth of the junction dopant region is shallower than 1200 Å. (The depth of the junction dopant region at any point on the interface between the silicide and the junction dopant region is the distance measured from this point in a direction normal to the plane before processing of the silicon substrate and down to the point of change of majority carrier type). The previously discussed diffusion temperatures and times generally yield a suitably shallow dopant junction region.

The following example is illustrative of the conditions suitable for producing the inventive device.

EXAMPLE

The fabrication procedure described in and with reference to FIGS. 9–17, of the aforementioned mutually assigned U.S. patent application Ser. No. 128,742 dated Dec. 4, 1987 was followed except the implantation dose, diffusion temperature, and diffusion time shown in the table were employed.

| Diffusion Temperature and Time | Dose $I^2$ (cm$^{-2}$) | Depth Beyond Silicide in Angstroms | Outside Silicide | Leakage Current (A/micron$^2$) | Activation Energy (eV) | Holding Voltage at 4 micron n$^+$ to p$^+$ Spacing (Volts) |
|---|---|---|---|---|---|---|
| 950° C. No Silicide | $2 \times 10^{15}$ | 2500** | $2 \times 10^{15}$ | $<10^{-18}$ | 1.12 | 1.1 |
| 900° C. 30 min | $8 \times 10^{15}$ | 1200** | $6 \times 10^{14}$** | $<10^{-18}$ | 1.12 | $<1.4$ |
| 800° C. 180 min | $2 \times 10^{15}$ | 500* | $5 \times 10^{12}$* | $1.4 \times 10^{-14}$ | .68 | 3.6 |
| 800° C. 120 min | $2 \times 10^{15}$ | 400** | $4 \times 10^{12}$** | $2 \times 10^{-14}$ | .65 | 3.8 |

*determined by SIMS measurements
**determined by computer simulation

Figure 3:
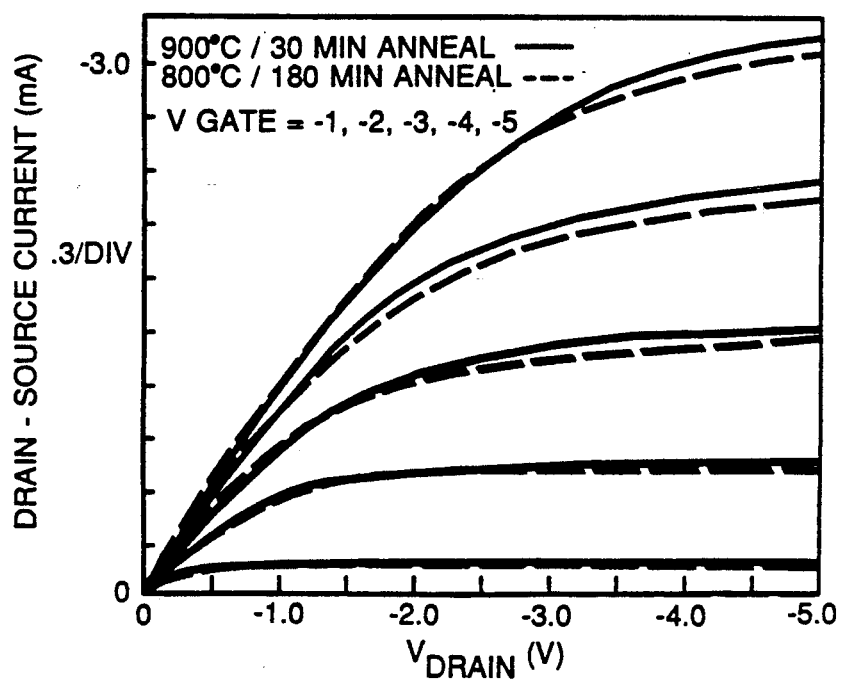
Figure 4:
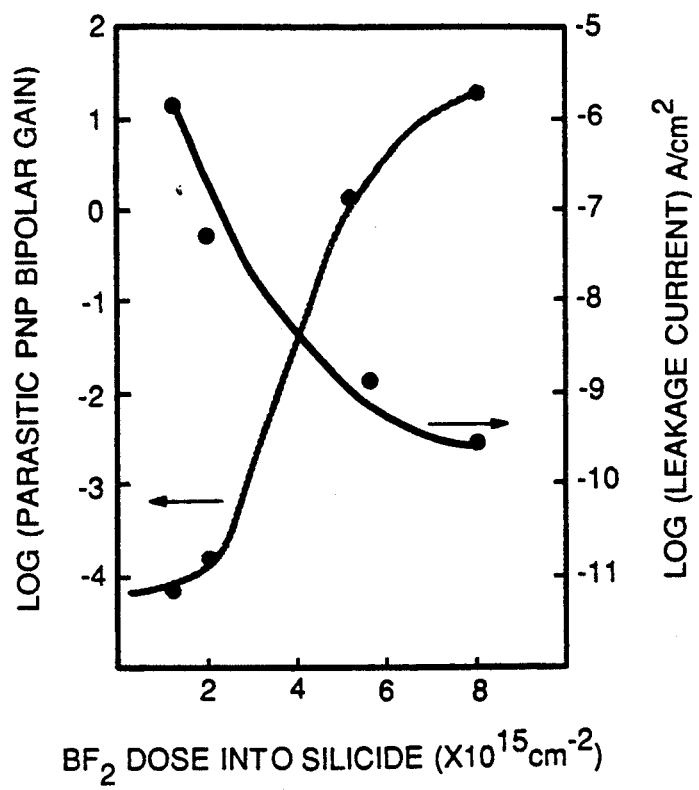
Figure 5:
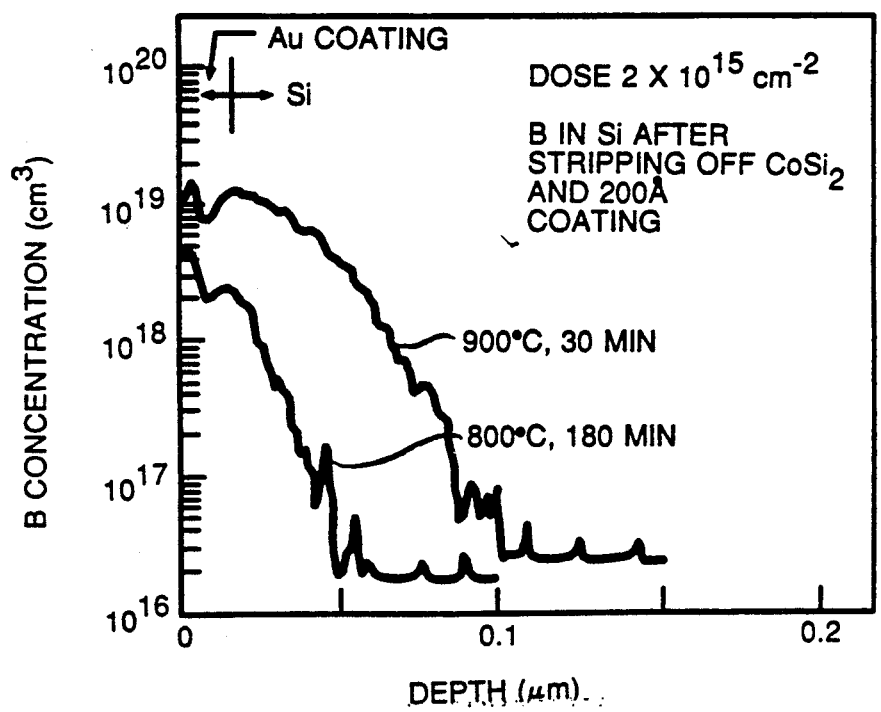
Figure 6B:
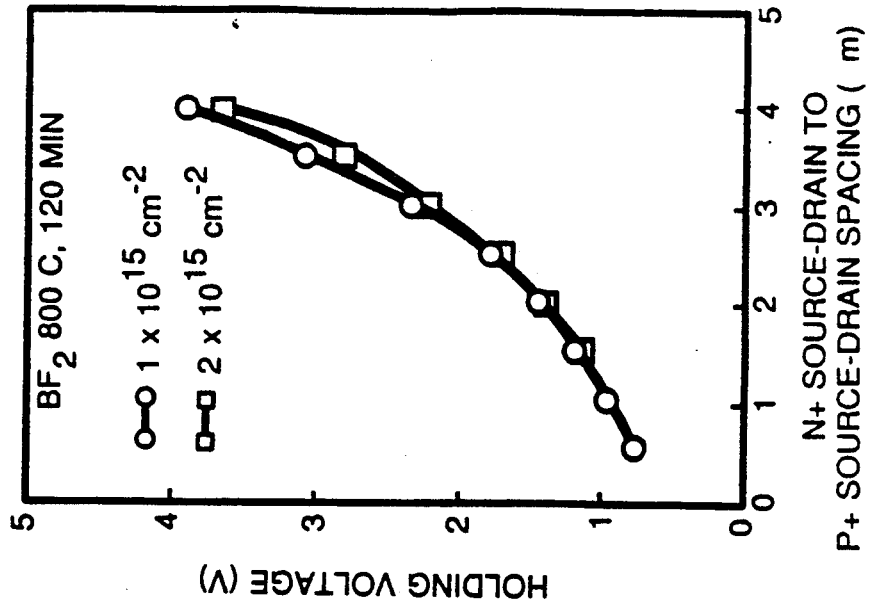
Figure 6A:
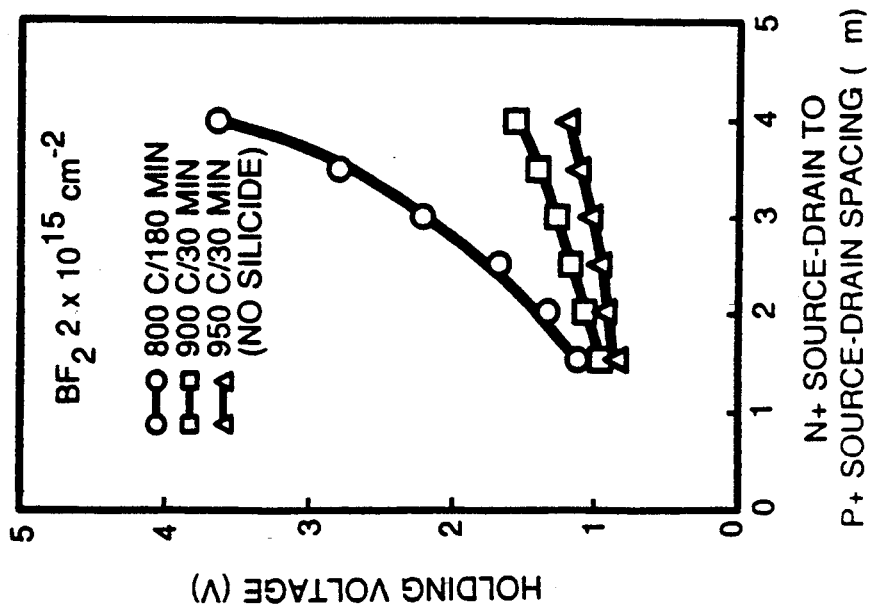
Figure 7A:
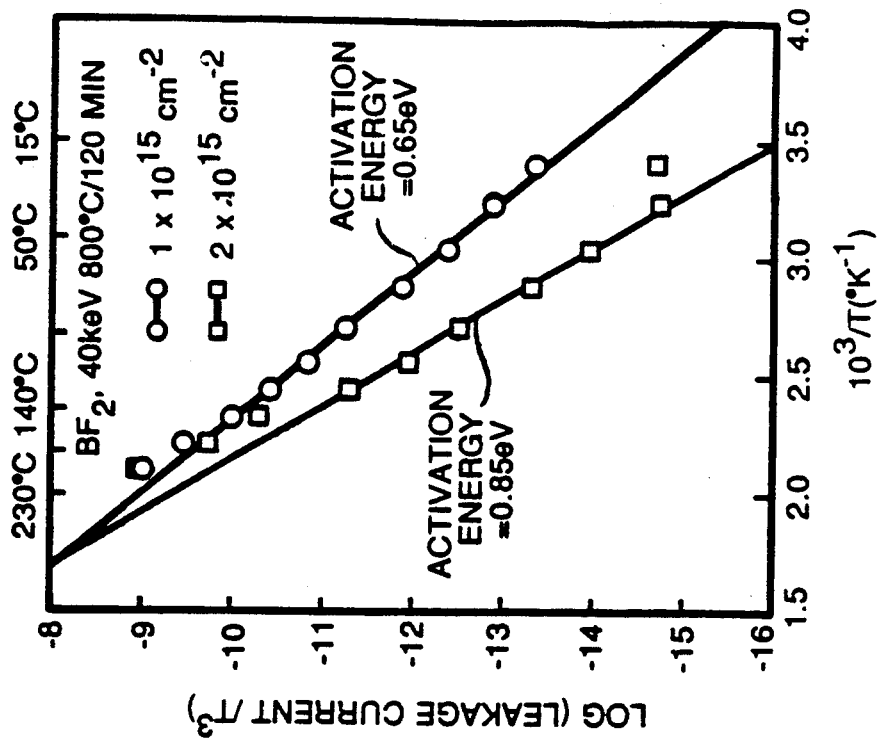
Figure 7B:
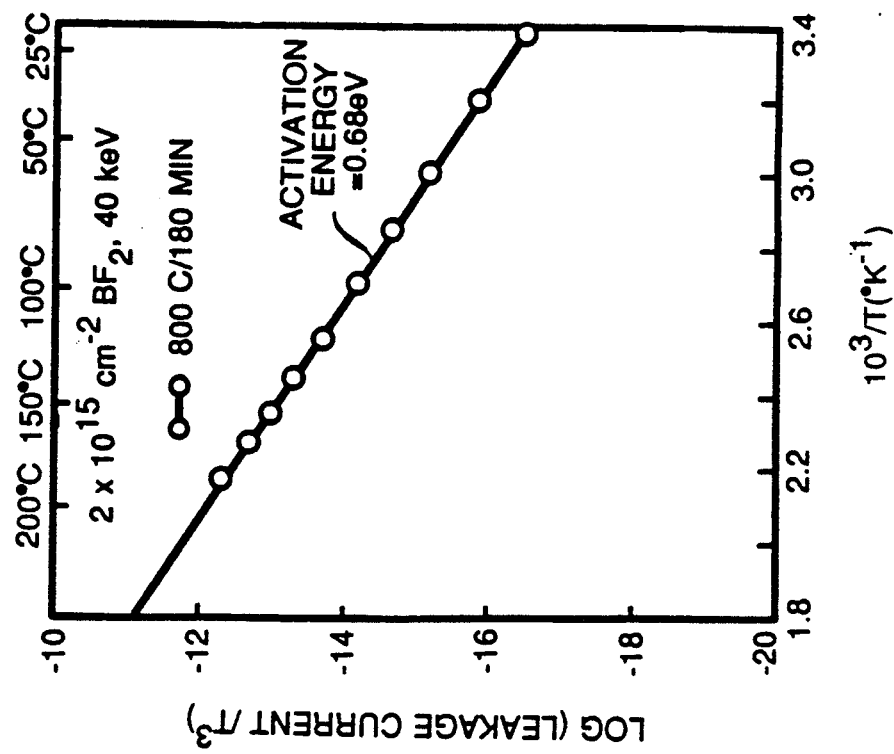

Some further properties of a representative sample of the resulting devices are shown in FIGS. 3 through 7, where FIG. 3 shows transistor characteristics, FIG. 4 shows leakage current and latch-up characteristics, FIG. 5 shows dopant profile, FIG. 6 shows holding voltage, (as well as the holding voltage of a sample made by the same procedure but with a $1 \times 10^{15}$ cm$^{-2}$ implant dose) and FIG. 7 shows activation energies.

We claim:

1. An article comprising a silicon substrate having an N-tub and a P-tub each of which includes one or more corresponding p-channel MOS and n-channel MOS devices, respectively,
   each such p-channel device having a p-type conductivity drain junction dopant region which forms a pn junction with the N-tub,
   a metal silicide layer contacting the drain junction dopant region, whereby an interface is formed between the metal silicide layer and the drain junction dopant region,
   said drain junction dopant region having an average depth, measure between said interface and said pn junction, equal to 1200 Å or less,
   said drain junction dopant region having a dopant concentration which is highest at said interface,
   the drain junction dopant region having an activation energy of reverse leakage current across its pn junction,
   the dopant concentration in the drain junction dopant region being such that the activation energy of reverse leakage current across said pn junction is less than about 0.85 eV.

2. The article of claim 1 wherein said silicide comprises titanium silicide.

3. The article of claim 1 wherein said silicide comprises a cobalt silicide.

4. The article of claim 3 wherein said dopant comprises a boron entity.

5. The article of claim 4 including a junction for electrical communication with said n-channel, said junction having an activation energy of the reverse leakage current of less than 0.85 eV.

6. The article of claim 2 including a junction for electrical communication with said n-channel, said junction having an activation energy of the reverse leakage current of less than 0.85 eV.

7. The article of claim 1 in which the activation energy is greater than about 0.65 eV.

8. The article of claim 1 in which the dopant concentration is less than about $2 \times 10^{15}$ per square centimeter.

9. The article of claim 8 in which the dopant is essentially boron.

10. The article of claim 8 in which the dopant concentration is greater than about $1 \times 10^{15}$ per square centimeter.

* * * * *